(12) United States Patent
Narasimhan et al.

(10) Patent No.: US 7,425,489 B1
(45) Date of Patent: Sep. 16, 2008

(54) SELF-ALIGNED SHALLOW TRENCH ISOLATION

(75) Inventors: Geethakrishnan Narasimhan, Sunnyvale, CA (US); Saurabh D. Chowdhury, Dallas, TX (US)

(73) Assignee: Cypress Semiconductor Corporation, San Jose, CA (US)

( * ) Notice: Subject to any disclaimer, the term of this patent is extended or adjusted under 35 U.S.C. 154(b) by 219 days.

(21) Appl. No.: 11/282,422

(22) Filed: Nov. 18, 2005

Related U.S. Application Data

(60) Provisional application No. 60/629,530, filed on Nov. 19, 2004.

(51) Int. Cl.
*H01L 21/336* (2006.01)
*H01L 21/76* (2006.01)
*H01L 21/3205* (2006.01)

(52) U.S. Cl. ............... 438/296; 438/453; 438/594; 257/E21.2; 257/E21.206; 257/E21.546; 257/E21.642; 257/E21.649

(58) Field of Classification Search ............... 438/294, 438/296, 299, 592, 594, 453; 257/E21.2, 257/E21.206, 546, 642, 649
See application file for complete search history.

(56) References Cited

U.S. PATENT DOCUMENTS

| 5,731,241 | A  | * | 3/1998 | Jang et al. | 438/424 |
| 6,235,627 | B1 | * | 5/2001 | Nakajima | 438/638 |
| 6,680,516 | B1 |   | 1/2004 | Blosse et al. | |
| 6,835,616 | B1 |   | 12/2004 | Ben-Tzur et al. | |
| 2004/0016956 | A1 | * | 1/2004 | Choi et al. | 257/315 |
| 2006/0001112 | A1 | * | 1/2006 | Lee | 257/412 |

OTHER PUBLICATIONS

Encyclopedia of Chemical Technology, Kirk-Othmer, vol. 14, pp. 677-709, (1995).

* cited by examiner

*Primary Examiner*—Zandra Smith
*Assistant Examiner*—Ron E Pompey
(74) *Attorney, Agent, or Firm*—Evan Law Group LLC

(57) ABSTRACT

A method of making a semiconductor structure includes etching an isolation oxide. The isolation oxide is in a substrate, a gate layer is on the substrate, a patterned metallic layer is on the gate layer, and a first patterned etch-stop layer is on the metallic layer.

20 Claims, 6 Drawing Sheets

SELF-ALIGNED SHALLOW TRENCH ISOLATION

CROSS-REFERENCE TO RELATED APPLICATION

This application claims priority to provisional application No. 60/629,530 entitled "POLY ETCH APPROACH TO PREVENT HIGH OXIDE STEP HEIGHT AND SPACER STRINGE IN SELF ALIGNED STI SCHEME" filed 19 Nov. 2004.

BACKGROUND

Shallow trench isolation (STI) is employed to isolate integrated circuit elements in a semiconductor wafer. A conventional STI process includes forming and patterning a silicon nitride layer on a silicon substrate, etching a trench in the substrate, and filling the trench with an oxide. The isolation oxide is then formed by chemical-mechanical polishing of the oxide in the trench using the silicon nitride as an etch-stop, followed by stripping the silicon nitride. STI has gained popularity because it allows for higher device density than LOCOS isolation.

STI is typically formed prior to forming gate stacks in active regions of the substrate. A gate stack may include a polycrystalline silicon (poly) gate, a tungsten layer on the poly, and a silicon nitride layer on the tungsten layer. Typically, the layers are formed first, and then they are patterned in turn, to form the gate stack.

BRIEF SUMMARY

In a first aspect, the present invention is a method of making a semiconductor structure, comprising etching an isolation oxide. The isolation oxide is in a substrate, a gate layer is on the substrate, a patterned metallic layer is on the gate layer, and a first patterned etch-stop layer is on the metallic layer.

In a second aspect, the present invention is a method of making a semiconductor structure, comprising (a) forming an isolation oxide in a substrate, and (b) forming a gate stack on the substrate. Forming an isolation oxide in a substrate is by a process comprising (a.i) forming a poly layer and an initial silicon nitride layer on the substrate; (a.ii) etching the initial silicon nitride layer, the poly layer and the substrate, to form a trench in the substrate; and (a.iii) filling the trench with oxide, chemical-mechanical polishing the oxide, and removing the initial silicon nitride layer, to form the isolation oxide. Forming a gate stack on the substrate is by a process comprising (b.i) forming a tungsten layer and a subsequent silicon nitride layer, on the poly layer; (b.ii) patterning the subsequent silicon nitride layer and the tungsten layer; (b.iii) etching the isolation oxide; and (b.iv) patterning the poly layer, to form the gate stack.

In a third aspect, the present invention is a method of forming a shallow trench isolation, including forming an etch-stop layer on a substrate, patterning the etch-stop layer, forming a trench in the substrate, filling the trench with oxide, chemical-mechanical polishing the oxide stopping on the etch-stop layer, and stripping the etch-stop layer, the improvement comprising forming a gate layer on the substrate prior to forming the etch-stop layer, etching the gate layer after patterning the etch-stop layer, and etching the oxide during patterning of a gate stack.

DETAILED DESCRIPTION

One current approach to forming STI is self-aligned shallow trench isolation (SA-STI), which includes forming a gate layer, typically of poly, on the substrate prior to forming and patterning the silicon nitride layer, and then patterning the poly before forming the trench in the substrate. One problem with this approach is that it leaves a high oxide step in the STI, due to the added thickness of the gate layer. The high oxide step causes nitride stringers after the spacer etch. Though the nitride stringers may be beneficial to prevent exposure of the SA-STI corner to contact formation, it reduces the bottom contact area and hence increases contact resistance.

One approach to reducing the oxide step height is to add a hydrogen fluoride dip at the subsequent nitride strip. However, this may cause a high step height for tungsten. A greater tungsten over etch may be used to reduce the high step height of the tungsten, but this may cause pitting into the silicon due to non-selectivity of the tungsten etch to silicon.

The present invention is based on the discovery that including an oxide etch after formation of a SA-STI reduces the height of the isolation oxide. By reducing the height of the isolation oxide in this way, nitride stringer formation is reduced, and problems associated with other methods of reducing the height of the isolation oxide are avoided. Advantages of the present invention include: (i) the ability to lower the isolation oxide step height in situ with the gate layer; (ii) no additional cleaning steps required to lower the isolation oxide step height; (iii) reduction or elimination of spacer stringer following the spacer etch; and (iv) less severe tungsten topography.

Figure 1:
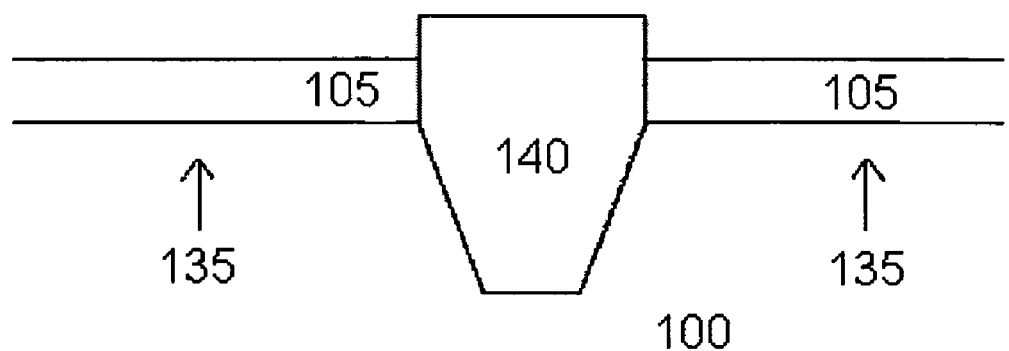
FIG. 1 illustrates a semiconductor structure after formation of a self-aligned shallow trench isolation but prior to formation of a gate structure.

FIG. 1 illustrates a semiconductor structure, after formation of a SA-STI, but prior to formation of a gate structure. The SA-STI is formed in the same way as conventional STI structures, except that a gate layer is formed on the substrate prior to forming the etch-stop layer and the trench in the substrate. For example, the gate layer 105 may be formed on a gate insulating layer 102 (not illustrated) on a semiconductor substrate 100. A nitride layer (not illustrated) is then formed on the gate layer, and patterned to form an opening where the trench in the substrate will be formed. The gate layer is then patterned to form an opening corresponding with the opening in the nitride layer, and the trench is formed through the opening, in the substrate. The trench is then filled with oxide, chemical-mechanical polishing is used to bring the height of the oxide to the level of the nitride layer, and the nitride layer is removed, thus forming the isolation oxide 140. As illustrated, the height of the isolation oxide above the substrate is about the same as the thickness of the gate layer and the nitride layer. In contrast, the height of the isolation oxide in a conventional STI structure is about the thickness of the nitride layer only, since a gate layer is not present during formation. Regions 135 of the semiconductor structure are active regions, and are the locations where gate stacks will be formed.

The semiconductor substrate may be a conventionally known semiconductor material. Examples of semiconductor materials include silicon, gallium arsenide, germanium, gallium nitride, aluminum phosphide, and alloys such as $Si_{1-x}Ge_x$ and $Al_xGa_{1-x}As$, where $0 \leq x \leq 1$. Preferably, the semiconductor substrate is silicon, which may be doped or undoped. The gate insulating layer may be a conventionally known insulating material. For example, the gate insulating layer may contain silicon oxide or silicon oxynitride.

The gate layer may contain a variety of semiconductor materials. Typically, a gate layer contains polycrystalline silicon (poly) or amorphous silicon. The gate layer may be doped with one type of dopant ($P^+$ or $N^+$), or it may contain both types of dopants in discrete regions. A split gate is a gate layer containing both $P^+$ and $N^+$ doping regions. In the case of a split gate, those regions of the gate layer that are $P^+$ doped (such as with B or $BF_2^+$) are over $N^-$ doped channel regions of the substrate, forming a PMOS device; those regions of the gate layer that are $N^+$ doped (such as with $As^+$ or phosphorus$^+$) are over $P^-$ doped channel regions of the substrate, forming an NMOS device. The doping of the regions of the gate layer is preferably carried out after or during the forming of the gate layer, by masking and doping each region separately, or by an overall doping of the gate layer with one dopant type, and then masking and doping only one region with the other dopant type (counter doping).

Figure 2:
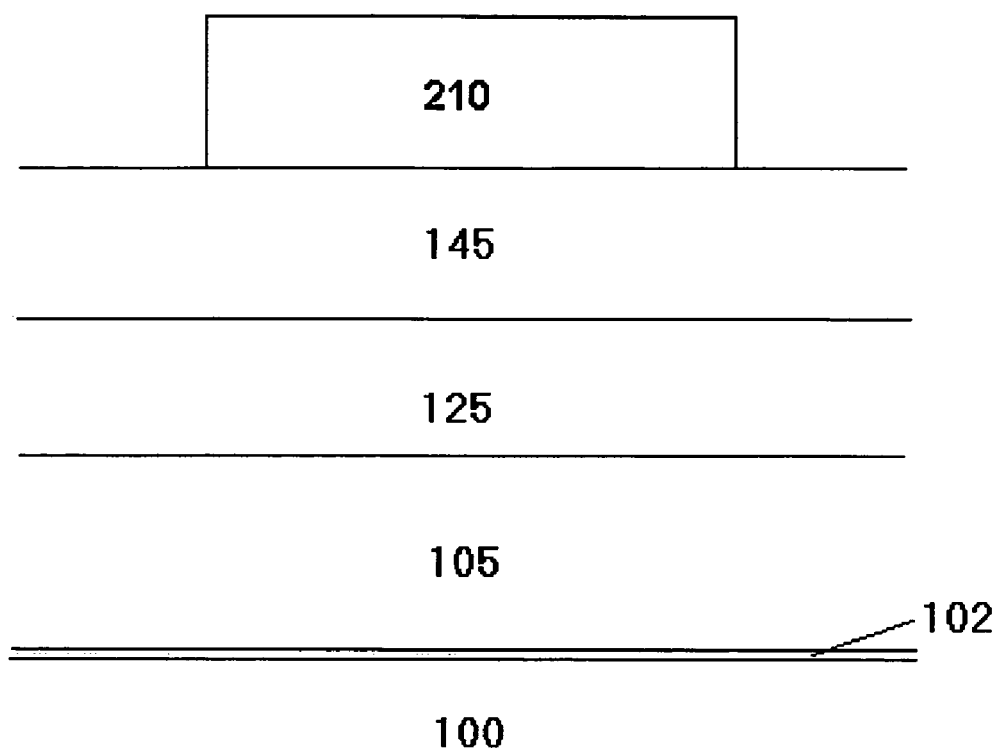
FIGS. 2-4 illustrate formation of a gate stack.
Figure 3:
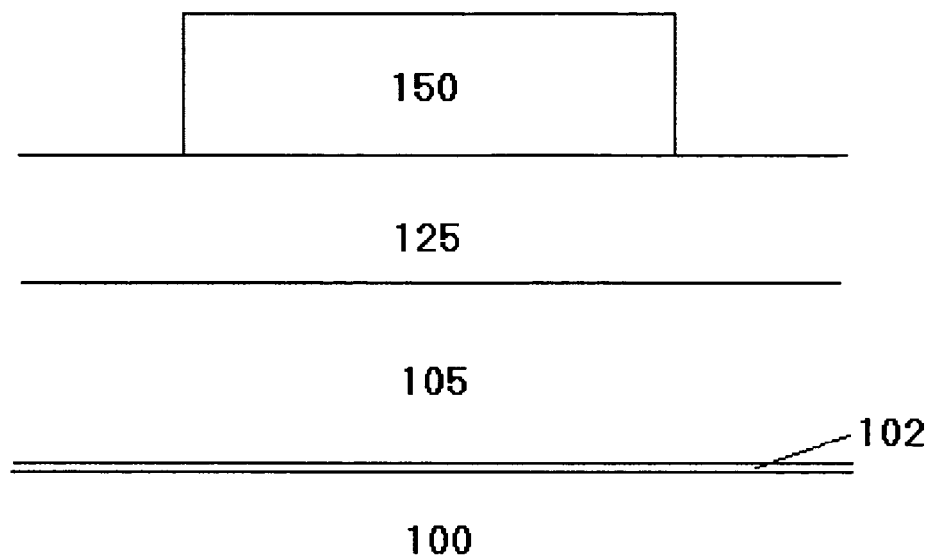
Figure 4:
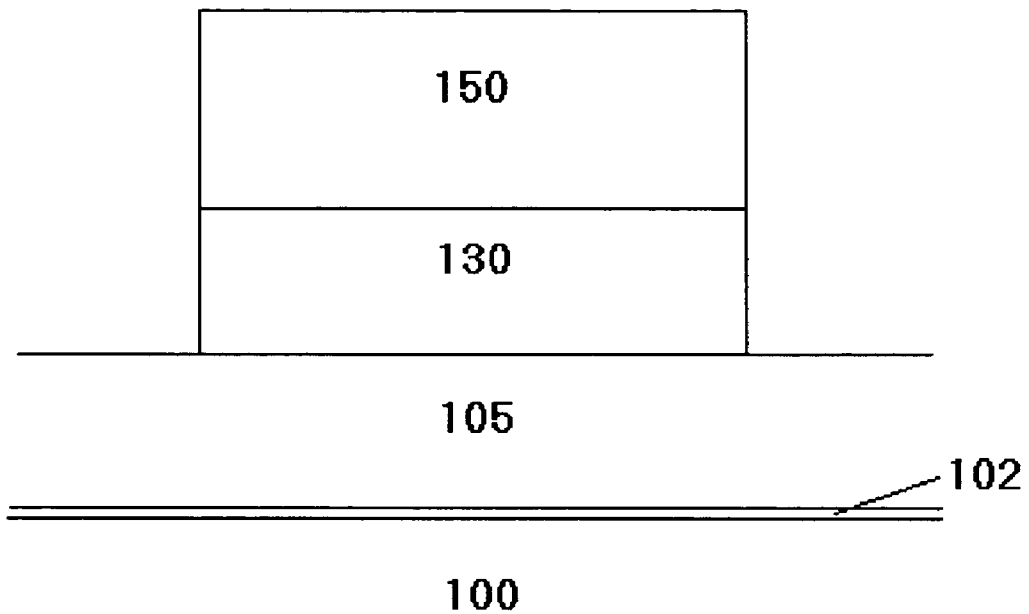

FIGS. 2-4 illustrate formation of a gate stack. Further details of an example of a gate stack may be found in U.S. Pat. No. 6,680,516 to Blosse et al. issued 20 Jan. 2004. As shown in FIG. 2, a metallic layer 125 is formed on the gate layer 105, an etch-stop layer 145 is formed on the metallic layer, and a photoresist layer 210 is formed and patterned on the etch-stop layer.

The metallic layer 125 may contain a variety of metal-containing materials. For example the metallic layer may contain aluminum, copper, tantalum, titanium, tungsten, or alloys or compounds thereof. Preferably, the metallic layer comprises tungsten. Preferably, the etch-stop layer is a nitride layer, more preferably the etch-stop layer is silicon nitride formed by PECVD. The etch-stop layer may vary in composition, so that the top of the etch-stop layer is anti-reflective, for example so that the top of the etch-stop layer is silicon rich silicon nitride, or silicon oxynitride. Alternatively, a separate anti-reflective layer (ARC) may be formed.

Referring to FIGS. 3 and 4, each layer may be patterned to form the gate stack. The patterning may be accomplished, for example, by conventional photolithographic and etching techniques. As shown in FIG. 3, the etch-stop layer may be etched to form a patterned etch-stop layer 150, for example by etching the portions of the etch-stop layer 145 exposed through the patterned photoresist 210 (FIG. 2). The patterned etch-stop layer may be used as a hard mask for the etching of the metallic layer 125 (FIG. 3) to form a patterned metallic layer 130, as shown in FIG. 4.

After the metallic layer is etched (a main etch and an over etch), the etch chemistry is switched to etch oxide, by changing the composition of gasses introduced into the tool. This oxide etch chemistry is chosen to selectively etch oxide to poly, and enough oxide is etched to lower the step height of the isolation oxide, typically 50 to 500 Angstroms, for example 300 Angstroms. The etch chemistry is changed again, and the gate layer 105 is patterned to form a patterned gate layer 110, using the patterned etch-stop layer as a hard mask.

The etch-stop layer may be patterned using standard etch chemistries, for example using a plasma at a pressure of 30 mTorr, at a power of 500 W, and at a temperature of 60° C., with gasses including $CHF_3$ at 275 sccm and $CF_4$ at 300 sccm, when the etch-stop layer is silicon nitride. The metallic layer may be patterned using standard etch chemistries, for example using a plasma at a pressure of 30 mTorr, at a power of 5-500 W, with gasses including $SF_6$, $CHF_3$, $NF_3$ and/or $N_2$, when the metallic layer is tungsten. The oxide etch chemistry may also standard, for example etching with gasses including $CHF_3$ and $CF_4$. The etch chemistries used for patterning the gate layer may be standard, for example using a xenon difluoride etch chemistry ($XeF_2$, HBr, He and $O_2$) for a poly gate layer. Preferably, the forming of an opening in the etch-stop layer, etching the exposed portion of the metallic layer, etching the oxide and etching the gate layer, are all carried out in the same reactor or tool. More preferably, the tool is either a Magnetically Enhanced Reactive Ion Etch (MERIE) or Inductively Coupled Plasma (ICP) reactor.

Figure 5:
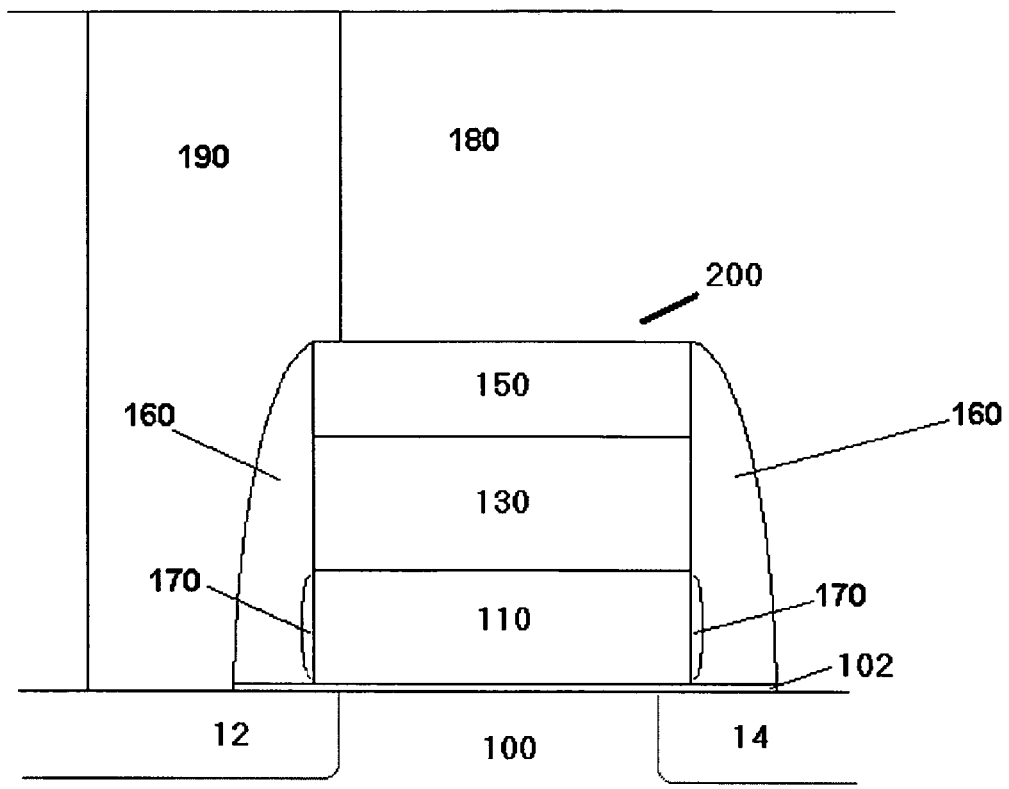
FIG. 5 illustrates a semiconductor structure including a gate stack.

FIG. 5 illustrates a semiconductor structure including a gate stack 200 which may be formed on a semiconductor wafer. Semiconductor substrate 100 supports a gate insulating layer 102, which in turn supports a gate layer 110. The gate layer supports a metallic layer 130. The etch-stop layer 150 is on the metallic layer 130. Further processing of the gate structure may include forming sidewall oxide regions 170 on gate layer 110 and forming spacers 160 (preferably containing nitride) on the sides of the gate stack. Furthermore, a dielectric layer 180 may be formed on the etch-stop layer, and contacts or vias 190 formed through the dielectric to the substrate.

Figure 6:
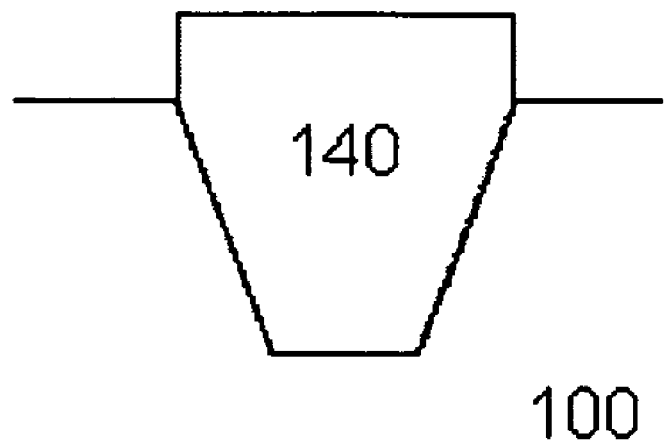
FIG. 6 illustrates a self-aligned shallow trench isolation of the present invention.

Other processing may be used to complete formation of semiconductor devices from the semiconductor structure. For example, source/drain regions 12, 14 may be formed in the substrate, additional dielectric layers may be formed on the substrate, and contacts and metallization layers may be formed on these structures. These additional elements may be formed before, during, or after formation of the gate stack. FIG. 6 illustrates a SA-STI, where the isolation oxide 140 has a height above the substrate 100 as compared with a SA-STI formed by a process which does not include an oxide etch during formation of the gate stack.

The related processing steps, including the etching of the gate stack layers and other steps such as polishing, cleaning, and depositing, for use in the present invention are well known to those of ordinary skill in the art, and are also described in Encyclopedia of Chemical Technology, Kirk-Othmer, Volume 14, pp. 677-709 (1995); Semiconductor Device Fundamentals, Robert F. Pierret, Addison-Wesley, 1996; Wolf, Silicon Processing for the VLSI Era, Lattice Press, 1986, 1990, 1995 (vols 1-3, respectively); Microchip Fabrication 4rd. edition, Peter Van Zant, McGraw-Hill, 2000; U.S. Pat. No. 6,835,616 to Ben-Tzur et al. issued 28 Dec. 2004 and references cited therein; and U.S. Pat. No. 6,680,516 to Blosse et al. issued 20 Jan. 2004.

The semiconductor structures of the present invention may be incorporated into a semiconductor device such as an integrated circuit, for example a memory cell such as an SRAM, a DRAM, an EPROM, an EEPROM etc.; a programmable logic device; a data communications device; a clock generation device; etc. Furthermore, any of these semiconductor devices may be incorporated in an electronic device, for example a computer, mobile phone, an airplane or an automobile.

The invention claimed is:

1. A method of making a semiconductor structure, comprising:
   etching an isolation oxide, with oxide etch chemistry, after patterning a metallic layer; wherein the oxide etch chemistry selectively etch oxide to poly wherein the isolation oxide is in a substrate,
a gate layer is on the substrate,
the patterned metallic layer is on the gate layer, and
a first patterned etch-stop layer is on the metallic layer.

2. The method of claim 1, wherein
the gate layer comprises poly,
the patterned metallic layer comprises tungsten, and
the first patterned etch-stop layer comprises silicon nitride.

3. The method of claim 2, further comprising etching the gate layer to form a patterned gate layer;
wherein a gate stack comprises the patterned gate layer, the patterned metallic layer, and the first patterned etch-stop layer.

4. The method of claim 2, wherein the isolation oxide is a shallow trench isolation.

5. The method of claim 2, further comprising:
forming a trench in the substrate;
filling the trench with oxide; and
polishing the oxide with chemical-mechanical polishing, to form the isolation oxide.

6. The method of claim 5, wherein the forming of the trench in the substrate comprises:
forming the gate layer on the substrate;
forming and patterning a second etch-stop layer on the gate layer;
etching the gate layer to expose a portion of the substrate; and
forming the trench in the substrate.

7. The method of claim 2, further comprising:
forming the gate layer, followed by
forming the isolation oxide.

8. The method of claim 3, further comprising:
forming the gate layer, followed by
forming the isolation oxide.

9. The method of claim 8, wherein the etching of the isolation oxide and the etching of the gate layer, are both carried out in one tool without removing the substrate from the tool between the etching of the isolation oxide and the etching of the gate layer.

10. A method of making a semiconductor device, comprising:
forming a semiconductor structure by the method of claim 2, and
forming a semiconductor device from the semiconductor structure.

11. A method of making an electronic device, comprising:
forming a semiconductor device by the method of claim 10, and
forming an electronic device comprising the semiconductor device.

12. A method of making a semiconductor structure, comprising:
(a) forming an isolation oxide in a substrate by a process comprising:
(a.i) forming a poly layer and an initial silicon nitride layer on the substrate;
(a.ii) etching the initial silicon nitride layer, the poly layer and the substrate, to form a trench in the substrate; and
(a.iii) filling the trench with oxide, chemical-mechanical polishing the oxide, and removing the initial silicon nitride layer, to form the isolation oxide; and
(b) forming a gate stack on the substrate by a process comprising:
(b.i) forming a tungsten layer and a subsequent silicon nitride layer, on the poly layer;
(b.ii) patterning the subsequent silicon nitride layer and the tungsten layer; followed by
(b.iii) etching the isolation oxide, with oxide etch chemistry, wherein the oxide etch chemistry selectively etch oxide to poly; and
(b.iv) patterning the poly layer, to form the gate stack.

13. The method of claim 12, wherein (b.ii) the patterning of the subsequent silicon nitride layer and the tungsten layer, (b.iii) the etching of the isolation oxide, and (b.iv) the patterning of the poly layer, are all carried out in one tool without removing the substrate from the tool.

14. A method of making a semiconductor device, comprising:
forming a semiconductor structure by the method of claim 13, and
forming a semiconductor device from the semiconductor structure.

15. The method of claim 14, wherein the semiconductor device comprises a split gate.

16. A method of making an electronic device, comprising:
forming a semiconductor device by the method of claim 15, and
forming an electronic device comprising the semiconductor device.

17. In a method of forming a shallow trench isolation, including forming an etch-stop layer on a substrate, patterning the etch-stop layer, forming a trench in the substrate, filling the trench with oxide, chemical-mechanical polishing the oxide stopping on the etch-stop layer, and stripping the etch-stop layer, the improvement comprising forming a gate layer on the substrate prior to forming the etch-stop layer, etching the gate layer after patterning the etch-stop layer, and etching the oxide, with oxide etch chemistry; wherein the oxide etch chemistry selectively etch oxide to poly, after patterning a metallic layer on the gate layer.

18. The method of claim 17, wherein the etch-stop layer comprises silicon nitride and the gate layer comprises poly.

19. The method of claim 18, further comprising patterning the gate layer after etching the oxide.

20. The method of claim 19, wherein the etching of the oxide and the patterning of the gate layer, are both carried out in one tool without removing the substrate from the tool between the etching of the oxide and the patterning of the gate layer.

* * * * *